(12) United States Patent
Jean

(10) Patent No.: US 6,265,051 B1
(45) Date of Patent: Jul. 24, 2001

(54) EDGE CONNECTORS FOR PRINTED CIRCUIT BOARDS COMPRISING CONDUCTIVE INK

(75) Inventor: Denis Jean, Grayslake, IL (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/197,685

(22) Filed: Nov. 20, 1998

(51) Int. Cl.$^7$ ....................................... B32B 3/00
(52) U.S. Cl. .................. 428/209; 174/250; 174/257; 439/59; 439/87; 252/503; 252/511; 252/514; 428/901
(58) Field of Search .................. 252/503, 511, 252/514; 439/87, 59; 174/257, 259, 250; 428/209, 901

(56) References Cited

U.S. PATENT DOCUMENTS

| | | |
|---|---|---|
| 4,045,636 | 8/1977 | Yoder et al. ............... 200/292 |
| 4,243,455 | 1/1981 | Shiba et al. ............... 156/187 |
| 4,517,739 | 5/1985 | Lenaerts et al. ............ 29/846 |
| 4,545,926 * | 10/1985 | Fouts, Jr. et al. .......... 252/511 |
| 4,578,215 | 3/1986 | Bradley ................... 252/514 |
| 4,896,250 | 1/1990 | Sullivan .................. 361/523 |
| 4,917,466 * | 4/1990 | Nakamura et al. .......... 350/336 |
| 4,964,948 | 10/1990 | Reed ..................... 156/659 |
| 5,042,971 | 8/1991 | Ambrose .................. 439/77 |
| 5,049,313 | 9/1991 | Frentzel .................. 252/511 |
| 5,057,245 | 10/1991 | Frentzel et al. ........... 252/511 |
| 5,100,695 | 3/1992 | Kawakami et al. .......... 427/96 |
| 5,250,228 * | 10/1993 | Baigrie et al. ............ 252/511 |
| 5,380,271 | 1/1995 | Gyory .................... 604/20 |
| 5,484,648 * | 1/1996 | Odashima et al. .......... 428/209 |
| 5,599,595 | 2/1997 | McGinley et al. .......... 428/33 |
| 5,688,146 | 11/1997 | McGinley et al. .......... 439/637 |
| 5,716,663 | 2/1998 | Capote et al. ............ 427/96 |
| 5,928,547 * | 7/1999 | Shea et al. .............. 219/505 |

FOREIGN PATENT DOCUMENTS 0 538 978 A2   4/1993   (EP) .

OTHER PUBLICATIONS

Electrochemical Publications Ltd., Isle of Mann, British Isles, by Malcolm Haskard and Keith Pitt; 1997.*
"Low cost edge tabs for circuit cards and hybrid substrates" Research Disclosure., No. 302, Jun. 1989, p. 441 XP000034774 Industrial Opportunities Ltd. Havant., GB ISSN: 0374–4353.
Wall, C.I., "Polymer Thick Films: What Are They, How Are They Used and Where?" *Circuit World*, vol. 12, No. 2, pp. 1–4 (1986). No month.
"Electra Thick Film Profile. PTF Polymer Thick Film. What Is It; And How Is It Used?" *Electra Polymers & Chemicals, Ltd.*, (1984/85) pp. 1–9. No month.
Technical Data Sheet ED7000 Series, "Carbon Resistor Pastes For Rigid Circuit Boards", *Electra Polymers & Chemicals, Ltd.*, ED7000–09/97rev5, pp. 1–2. No date.
"Goldstone #3000 Conductive Overprint Ink", *Methode Development Co.*, #840330, (1984). No month.

* cited by examiner

*Primary Examiner*—Cathy Lam
(74) *Attorney, Agent, or Firm*—McDonnell Boehnen Hulbert & Berghoff

(57) ABSTRACT

Disclosed are edge contacts for printed circuit boards comprising a copper lead coated with conductive ink comprising a binder and graphite powder, carbon black, and silver flakes. Also disclosed are printed circuit boards containing the contacts and methods for manufacturing the contacts and circuit boards.

17 Claims, No Drawings

EDGE CONNECTORS FOR PRINTED CIRCUIT BOARDS COMPRISING CONDUCTIVE INK

BACKGROUND OF THE INVENTION

1. Field of the Invention

This invention relates to a printed circuit boards and, more specifically, to edge connectors disposed at the periphery of printed circuit boards.

2. Description of the Related Art

Printed circuit boards of the type used in various computer hardware, e.g., modems, commonly include a copper conductor over which is applied a layer of nickel metal followed by a layer of gold. Because of the complexity of applying a layer of gold over a layer of nickel on a copper conductor, and the associated relatively high cost of gold, there exists a need for a replacement for the gold and nickel materials in edge connectors on printed circuit boards.

The blending of resins or adhesives with powdered conductive materials such as, gold, silver, copper, nickel or other metals or alloys, provides conductive pastes or inks. Such materials, also known as polymer thick films (ptf), generally fall into two classes. One class is the thermosetting kind (preferred for permanence) of which the epoxys, acrylics, and polyesters are examples. The other class is the thermoplastic kind (which soften when heated) composed of synthetic or natural polymer, (such as, polyimide siloxane, nylon, neoprene, or rubber) in a solvent or other suitable carrier.

For further information pertaining to conductive inks, conductive adhesive inks, adhesives and surface mount technology, in general, the reader is directed to Radio-Electronics, page 59 et seq., November, 1987, "Introduction to SMT", by Forrest M.

Conductive inks typically include metals such as silver, copper, lead or tin to provide electrical conductivity together with polymeric binders which provide adhesion.

Conductive inks have been applied by screen printing onto non-moldable insulating baseboard substances, such as FR4 or glass epoxy.

However, when printed circuit boards are manufactured by applying a conductive paste such as copper paste on the insulating base board by screen printing, there is generally inadequate adhesion of the conductive paste or ink to the circuit terminal portion. This is particularly pervasive when heat is applied to the board during the soldering of electrical components to the terminal portion.

Also, specific levels of resistivity are required for use as edge connectors in Peripheral Component Interconnect (PCI), Industry Standard Architecture (ISA), and Audio Modem Riser (AMR) buses.

SUMMARY OF THE INVENTION

The present invention provides edge connectors or edge contacts on printed circuit boards that overcome the disadvantages described above.

More specifically, the invention provides edge connectors or contacts in which the gold and nickel layers are replaced with a single layer of a conductive ink. The use of the conductive ink as an edge connector as described herein makes unnecessary the use of nickel plating between the upper layer of the connector and the copper conductor. Thus, not only is the use of gold avoided, but also the use of nickel, making the process more efficient and less expensive.

Thus, in one aspect, the invention provides edge connectors on a printed circuit board that are substantially permanent and do not crack or peal-off of the circuit board.

In another aspect, the invention provides printed circuit boards having at least one edge connector, where the edge connector comprises a copper conductor coated with a conductive ink where the ink generally has a sheet resistivity of about 0.1 to 0.5 $\Omega$/square/15 $\mu$m.

In a further aspect, the invention provides printed circuit boards having one or a plurality of edge connectors in which a copper conductor is coated with a conductive ink where the ink has a contact resistance of about $10 \times 10^{-3} \Omega$ to $70 \times 10^{-3} \Omega$.

The conductive ink suitable for use herein is a thermosetting resin containing graphite powder, carbon black and silver flakes. The silver loading is generally in the range of from about 10–50% by weight of the wet ink composition. The silver flakes suitable for use herein have a grind size not greater than about 10 $\mu$m. Viewed another way, the silver loading is from about 50–75% by volume of the ink composition. Such an amount is sufficient to provide the edge contact with a sheet resistivity of from about 0.1 $\Omega$/sq/15 $\mu$m to 0.5 $\Omega$/sq/15 $\mu$m and a contact resistance of from about $10 \times 10^{-3}$ to $70 \times 10^{-3} \Omega$.

While the inventive connector is particularly suitable for use in manufacturing ISA bus edge connectors, it may also be used in manufacturing PCI and AMR bus edge connectors.

The invention also provides methods for forming edge connectors on printed circuit boards comprising applying a conductive ink having a sheet reistivity of about 0.1 to about 0.5 $\Omega$/sq/15 $\mu$m over a copper conductor terminating at the edge of the circuit board. Generally, the conductive inks are applied to the circuit board using screen printing or other suitable technologies known to those skilled in the art.

DETAILED DESCRIPTION OF THE INVENTION

As used herein, the terms "ink" and "paint" are meant to be synonymous and each are intended herein to mean and include the other. Similarly, the terms "printing" and "painting" are also meant to be synonymous. Screen printing (or more accurately, polyester screening or stainless screening) is one method of "inking" or "painting".

The edge connectors of the invention comprise a copper conductor disposed on a printed circuit board where the copper is coated with conductive ink. The inks suitable for use herein comprise a thermosetting resin containing graphite powder, carbon black, and silver flakes. The printed circuit boards are preferably PCI, ISA, or AMR (Audio Modem Riser) buses. Those skilled in the art will recognize materials having characteristics similar to the carbon black and graphite powder that may be used in place of the carbon black and graphite powder without altering the required properties of the conductive ink.

The conductive ink coated on the edge connector, after application to the printed circuit board and curing, preferably has a sheet resistivity of from about 0.1–0.5 $\Omega$/square/15 $\mu$m, more preferably about 0.2–0.3 $\Omega$/square/15 $\mu$m, and most preferably about 0.25 $\Omega$/square/15 $\mu$m. Such resistivity provides electrical properties similar to those of conventional edge contacts.

In the printed circuit boards of the invention, the resistance across the edge connector is from about $10 \times 10^{-3} \Omega$ to $70 \times 10^{-3} \Omega$. Preferably, the edge connector has a contact resistance of about $50 \times 10^{-3}\Omega$, more preferably about $35 \times 10^{-3}\Omega$, and most preferably about $30 \times 10^{-3}\Omega$.

The method of manufacturing edge connectors on a printed circuit board according to the invention comprises applying a conductive ink over a copper conductor terminating at an edge of the circuit board. The cured ink generally has a sheet resistivity of from about 0.1 to 0.5 $\Omega$/sq/15 $\mu$m. More preferably, the sheet resistivity is from about 0.2 to 0.3 $\Omega$/sq/15 $\mu$m, and most preferably about 0.25 $\Omega$/sq/15 m.

The binder or resin is preferably an epoxy resin comprising phenolic monomers.

The conductive ink may be coated on the substrate using any of a variety of methods known in the art. The preferred method is screen printing according to well known procedures. Other methods include brush, roller, spraying, dipping, masking, vacuum plating, vacuum deposition or any combination of the foregoing. Generally, the methods include a heat curing step or curing in a vapor phase oven or with infrared (IR) or ultraviolet (UV) radiation to form a continuous electrical pathway.

More specifically, the method for applying the ink comprises first making a printing screen or stencil containing the pattern of the desired edge contacts. The processes and apparatus for screen printing and stencil printing are well known to those skilled in the art. The screen is then used in a screen printing apparatus to print multiple copies of the printed circuit on the substrate selected. Such substrates include polyimide, phenolic, epoxy, BT-epoxy, cyanate ester, or other thermoset laminates. The substrates may be flexible or, preferably, rigid. Alternatively, the substrate may be injection molded or extruded sheet of polyetherimide, polyethersulfone, polyetherketone, polyarylsulfone, liquid crystal polymer, or other thermoplastic. Other substrates may also be used, including ceramics, insulated metal sheets, glass, quartz, graphite or any other material to which the composition can be adhered and which can withstand the curing temperature.

After printing the uncured composition in the pattern of the desired printed circuit on the substrate, the composition is then cured by application of heat. A static oven may be employed. The heat source may be infrared, panel heater, convection, forced hot air, induction, vapor phase condensation, microwave, etc. Such heat sources and ovens are well known to those skilled in the art. A conveyorized system having multiple stages may be used to heat, dry, cure, and then cool the composition in a controlled way. If needed, components may be soldered to the printed circuit with a solder wave, soldering iron, hot air gun, or solder paste reflow, all common techniques well known in the art. Alternatively, components may be adhered to the printed circuit using a conductive ink. The inks suitable for adhering components the board may be the inks of the invention or other readily available inks.

The printed or cured conductive inks on the edge contacts have a thickness of approximately 15 $\mu$m.

The composition of the ink includes a thermosetting or radiation curable binder which may optionally be thinned with a thinner, as well as the electrically conductive particles, preferably a mixture of silver flake and carbon black. Optionally, the composition may include an agent, e.g., fumed silica, to modify the thixotropic characteristics of the ink, preferably. The relative proportions of these components, especially the binder and the thinner, encourage wetting of the ink to the surface of the substrate and a surface tension that leaves a relatively thin, smooth film of ink adhering to the surface of the circuit board.

The thickness of film is sufficient that when the film cures, it provides the necessary conductivity. However, the film is not so thick that the resulting layer of ink will separate from the substrate or restrict the insertion of the board into an appropriate receptacle.

While various conductive inks may be used to achieve the requisite durability when the ink is cured, suitable conductivity across the connector is achieved using the proper loading of appropriately sized silver flakes. Such flakes have a grind size not greater than about 10 $\mu$m and comprise about 10–50% by weight of the ink. A preferred amount of silver flakes in the composition is from about 35–50%, more preferably from about 40–50%, by weight of the ink composition. The amount of silver flakes suitable for use herein, based on the volume of the ink composition, is from about 50 to 75%.

Other inks that may be used herein include copper or silver based compositions containing silver oxide or tin and lead alloy binding compositions.

Optional components suitable for use in the preferred inks herein include copper, lead, tin and other metals.

The preferred resin is one that is heat curable, i.e., a thermosetting resin. Presently preferred is a phenolic epoxy resin.

The preferred ink for use herein comprises, by weight of the ink, (a) from about 10 to 40% of an epoxy resin comprising phenolic monomers;

(b) from about 3 to 10% of carbon black;

(c) from about 8 to 20% of graphite powder;

(d) from about 10 to 50% of silver flakes having an average grind size not greater than about 10 $\mu$m.

More preferred compositions of the ink comprise, by weight of the ink, (a) from about 10 to 40% of an epoxy resin comprising phenolic monomers;

(b) from about 5 to 10% of carbon black;

(c) from about 12 to 20% of graphite powder;

(d) from about 10 to 50% of the silver flakes;

(e) up to about 30% thinner, preferably Carbitol®, Butyl Cellosolve® Acetate, or Butyl Carbitol®; and (f) up to about 8% methanol.

Particularly preferred compositions of the ink comprise, by weight of the ink, (a) from about 10 to 40% of an epoxy resin comprising phenolic monomers;

(b) from about 3 to 8% of carbon black;

(c) from about 8 to 18% of graphite powder;

(d) from about 10 to 55% of the silver flakes;

(e) from about 10–35% thinner, and (f) from about 4–8% methanol.

Variations in the above ink composition are possible; in preferred compositions, the quantities of binder and thinner generally will be approximately equal. However, in certain embodiments, the amount of thinner may be as low as about 1% by weight. Examples of preferred thinners are Carbitol®, Butyl Cellosolve® Acetate, or Butyl Carbitol®.

The carbon black within the ink composition tends to bridge gaps between the silver flakes, creating electrical continuity between the individual flakes of silver and reducing the possibility of electrical voids between the individual silver flakes.

Until fully cured, the electrical conductivity of the film of ink has not reached its highest value. Increased conductivity is achieved by shrinkage of the ink upon curing which brings conductive particles into more substantial contact. Curing occurs as a result of removal of thinner from the composition and the resulting action of the binder.

In a highly preferred embodiment, the conductive ink or ptf is Electrador® 5601 Carbon Conductor Paste, commercially available from Electra Polymers and Chemicals.

The edge contacts of the invention may be manufactured according to the following procedure.

Brush or chemically clean copper surfaces to provide a waterbreak-free surface.

Screen printing settings:

Screen mesh: about 200 mesh stainless steel about 145 mesh polyester minimum mesh opening about 39%

Squeegee: about 70 to 80 Shore

Emulsion: about 1–1.5 mil (25–28$\mu$)

Cure schedule:

convection oven: about 45 minutes at about 165° C.

IR tunnel oven: about 5 minutes at about 165° C.

The invention and the manner and process of making and using it, are now described in such full, clear, concise and exact terms as to enable any person skilled in the art to which it pertains, to make and use the same. It is to be understood that the foregoing describes preferred embodiments of the present invention and that modifications may be made therein without departing from the spirit or scope of the present invention as set forth in the claims. To particularly point out and distinctly claim the subject matter regarded as invention, the following claims conclude this specification.

What is claimed is:

1. A printed circuit board comprising at least one edge connector comprising a copper conductor coated with conductive ink comprising a thermoset epoxy binder, graphite powder, carbon black, and silver flakes, wherein the silver flakes have an average size not greater than about 10 $\mu$m and where the maximum resistance across the edge connector is about $70 \times 10^{-3} \Omega$.

2. A printed circuit board according to claim 1, wherein the edge connector is a PCI bus edge connector.

3. A printed circuit board according to claim 1, wherein the edge connector is an ISA bus edge connector.

4. A printed circuit board according to claim 1, where in the edge connector is an AMR bus edge connector.

5. A printed circuit board according to claim 2, wherein the binder is a cured epoxy resin comprising phenolic monomers.

6. A printed circuit board according to claim 3, wherein the binder is a cured epoxy resin comprising phenolic monomers.

7. A printed circuit board according to claim 1, wherein the conductive ink coated on the edge connector has a sheet resistivity of 0.25 $\Omega$/square/15 $\mu$m.

8. A printed circuit board according to claim 7, wherein the edge connector is an ISA bus edge connector.

9. A printed circuit board according to claim 8, wherein the binder is a cured resin comprising phenolic monomers.

10. A printed circuit board according to claim 1, wherein the binder is a cured thermosetting resin.

11. In an edge connector formed by a copper conductor terminating at the edge of a printed circuit board, the improvement comprising applying over the copper conductor a conductive ink comprising silver flakes where the silver flakes are in an amount sufficient to provide a sheet resistivity of from about 0.1 $\Omega$/sq/15 $\mu$m to 0.5 $\Omega$/sq/15 $\mu$m, the silver flakes having an average grind size not greater than about 10 $\mu$m.

12. The edge connector of claim 11 wherein the edge connector has a contact resistance of about $50 \times 10^{-3} \Omega$.

13. The edge connector of claim 11 wherein the edge connector has a contact resistance of about $35 \times 10^{-3} \Omega$.

14. The edge connector of claim 11 wherein the edge connector has a contact resistance of about $30 \times 10^{-3} \Omega$.

15. The edge connector of claim 11, wherein the conductive ink comprises thermosetting resin containing graphite powder, carbon black, and silver flakes.

16. The edge connector of claim 11, wherein the silver flakes have an average grind size of about 10 $\mu$m.

17. The edge connector of claim 11, wherein the amount of silver flakes is from about 50 to 75% by volume of the ink.

* * * * *